United States Patent [19]

Muraki

[11] Patent Number: 4,947,047
[45] Date of Patent: Aug. 7, 1990

[54] EXPOSURE SYSTEM WITH EXPOSURE CONTROLLING ACOUSTOOPTIC ELEMENT

[75] Inventor: Masato Muraki, Yokohama, Japan

[73] Assignee: Canon Kabushiki Kaisha, Tokyo, Japan

[21] Appl. No.: 151,550

[22] Filed: Feb. 2, 1988

[30] Foreign Application Priority Data

Feb. 5, 1987 [JP] Japan .................................. 62-25263

[51] Int. Cl.$^5$ .............................................. G01J 1/32
[52] U.S. Cl. .................................... 250/492.2; 250/205
[58] Field of Search ............... 250/205, 492.2, 201 R; 346/158, 159, 160

[56] References Cited

U.S. PATENT DOCUMENTS

| | | | |
|---|---|---|---|
| 3,778,791 | 12/1973 | Lewicki et al. | 250/205 X |
| 4,703,166 | 10/1987 | Bruning | 250/201 |
| 4,773,750 | 9/1988 | Bruning | 353/122 |
| 4,785,192 | 11/1988 | Bruning | 250/548 |
| 4,811,055 | 3/1989 | Hirose | 355/53 |

FOREIGN PATENT DOCUMENTS

| | | | |
|---|---|---|---|
| 0149024 | 8/1984 | Japan | 250/205 |
| 60-162218 | 8/1985 | Japan . | |
| 62-0026816 | 2/1987 | Japan . | |
| 62-187815 | 8/1987 | Japan . | |
| 63-10149 | 1/1988 | Japan . | |
| WO86/00427 | 1/1986 | World Int. Prop. O. . | |

OTHER PUBLICATIONS

Roshon, D. D., Jr., "Laser Modulation Control Method", IBM Tech. Dis. Bull., vol. 12, No. 3, Aug. 1969, p. 485.

Primary Examiner—Steven Mottola
Attorney, Agent, or Firm—Fitzpatrick, Cella, Harper & Scinto

[57] ABSTRACT

An exposure system is disclosed which uses a pulsed laser, such as an excimer, as the light source for exposure. For exposure control, an acoustooptic element is used. More specifically, the acoustooptic element is used to modulate the intensity of a pulsed laser beam emitted from the excimer laser, to thereby allow precise control of the exposure with respect to a wafer having a resist coating.

19 Claims, 2 Drawing Sheets

EXPOSURE SYSTEM WITH EXPOSURE CONTROLLING ACOUSTOOPTIC ELEMENT

FIELD OF THE INVENTION AND RELATED ART

This invention relates to an exposure system usable in the manufacture of microcircuits, such as integrated circuits. More particularly, the invention is concerned with an exposure apparatus which uses a pulsed laser, such as an excimer laser, as a radiation source for the exposure.

Recent developments in semiconductor technology have achieved further miniaturization and integration of electronic microcircuits. The prevalence of optical lithography for the manufacture of such microcircuits becomes greater due to the development of lens systems having higher resolving power. As is well known in the field of exposure apparatuses for the manufacture of semiconductor microcircuits, the resolvable linewidth of a circuit pattern that can be photoprinted on a wafer as a result of the exposure thereof to the circuit pattern formed on a mask or reticle, is proportional to the wavelength of light used for the exposure. Recently, Hg lamps have been used as an ultraviolet ray light source. Also, super high pressure Xe-Hg lamps have been used as a deep UV light source. However, currently available resist materials do not have high sensitivity to these lights, with the result that a long time is required for exposure. Accordingly, the throughput is low.

It has recently been contemplated to use, in a semiconductor device manufacturing exposure apparatus, an excimer laser which is a pulse-oscillation type high-power laser that produces light having a wavelength in the deep UV region. Due to high luminance, monochromaticity and short coherence length, the excimer laser is considered a very effective light source usable in exposure apparatus for the manufacture of semiconductor microcircuits.

Excimer lasers are excitation type light sources, excited by discharging. Accordingly, in order to assure that a desired radiation energy is supplied to a wafer when an excimer laser is used as a light source for illuminating a circuit pattern of a reticle, it may be considered to control the excitation voltage. With a too high excitation voltage, however, the excitation circuit, or the laser itself, will be damaged. If, on the other hand, the excitation voltage is too low, the laser will not oscillate. Therefore, it is not easy to change the output energy of the excimer laser to a large extent, by controlling the excitation voltage.

Excimer lasers provide a pulsed laser beam. The pulse emission time (i.e. the duration of one pulse) is very short, of the order of 10–20 nsec., and therefore, it is not easy to precisely control exposure by means of a mechanical shutter which has been used in conventional exposure systems.

SUMMARY OF THE INVENTION

It is accordingly a primary object of the present invention to provide an exposure system using a pulsed laser, such as an excimer laser, in which exposure can be controlled precisely and with certainty.

In accordance with one aspect of the present invention, to achieve this object, there is provided an exposure system having an excimer laser, in which a pulsed laser beam emitted from the excimer laser is subjected to accurate intensity modulation, with the result that the exposure can be controlled very precisely and stably.

In accordance with one preferred form of the present invention, which will be described later, an acoustooptic element is disposed in the path of a pulsed laser beam emitted from an excimer laser included in an exposure system. When the acoustooptic element is driven in response to an electric signal, a corresponding diffraction effect is produced. By using such diffraction effect, a portion of the pulsed laser beam is diffracted, whereby the intensity of the pulsed laser beam is modulated, as desired.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
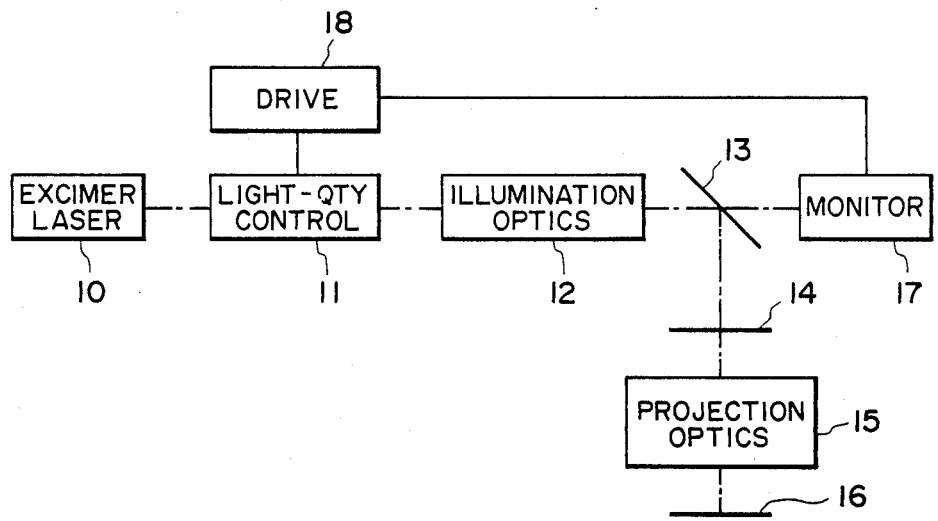
FIG. 1 is a schematic and diagrammatic view of an exposure apparatus according to an embodiment of the present invention.

Referring first to FIG. 1, there is shown an exposure apparatus according to one embodiment of the present invention. In this embodiment, the present invention is applied to a projection exposure system for use in the manufacture of semiconductor microcircuits.

Denoted at 10 in FIG. 1 is a KrF excimer laser which is adapted to produce a pulsed laser beam having a wavelength of about 248.5 nm. In this example, two laser resonators are used to provide an injection-lock type excimer laser. Thus, the excimer laser 10 can emit a pulsed laser beam of high intensity.

Denoted at 11 in FIG. 1 is a light quantity controlling device which includes an acoustooptic element having piezoelectric elements attached to a substrate made of silica, $SiO_2$. The pulsed laser beam from the excimer laser can pass through the substrate. The reason for the use of $SiO_2$ in the present embodiment as the material of the substrate of the acoustooptic element is to achieve efficient utilization of the pulsed laser beam on one hand and to improve the durability of the acoustooptic element on the other hand.

When an electric voltage (power) is applied to the piezoelectric elements, there occurs an elastic wave within the substrate of the acoustooptic element. By use of such an elastic wave, the intensity modulation is effected to the pulsed laser beam from the excimer laser 10.

Denoted at 12 in FIG. 1 is an illumination optical system for irradiating a surface 14, such as a reticle or a mask to be illuminated, with the light controlled by the light quantity controlling device 11 as desired. A reflector 13 is disposed to reflect the light from the illumination optical system 12 to the surface 14. The reflector 13 may have a portion which is semi-transparent with respect to the light from the excimer laser. Alternatively, the entire reflector 13 may be semi-transparent. A projection optical system 15 is provided to project a circuit pattern of a reticle or a mask, disposed in the plane 14, upon a surface 16 which is the surface of a wafer. The surface of the wafer has been coated with a suitable resist material having sensitivity to the light from the excimer laser used. A monitoring device 17 is provided to monitor the quantity of light directed to the surface 14. The monitoring device 17 produces an instruction signal, in response to which a driver 18 drives the light quantity controlling device 11.

The projection optical system 16 is provided by a lens system comprising a plurality of lens elements. As for the glass material for these lens elements, only $SiO_2$ may be used. Namely, each of these lens elements may be made of $SiO_2$. The projection optical system 16 is adapted to transfer the circuit pattern of the reticle or mask onto the wafer surface in a reduced scale such as, for example, 1:5 or 1:10.

The monitoring device 17 includes a photodetector having a light-receiving surface of a predetermined area, and a processing circuit for processing output signals from the photodetector. As will be described later, the processing circuit may be used to monitor the intensity of the pulsed laser beam as desired and/or to monitor the integrated exposure amount (total amount of exposure) by the pulsed laser beam.

In the present embodiment, the intensity of the pulsed laser beam from the excimer laser 10 can be controlled at a desired value by means of the light quantity controlling device 11, and the surface 14 can be illuminated by the illumination optical system 12 with the controlled light. At this time, a portion of the light for illuminating the surface 14 is extracted by the reflector 13 (or a portion thereof), the extracted light being received by the monitoring device 17. Thus, the monitoring device 17 can monitor the intensity of the pulsed laser beam directed to the surface 14. If the intensity of the pulsed laser beam changes and thus deviates from the desired value, the monitoring device 17 applies to the driver 18, an instruction signal instructing correction for compensation of the deviation. In response to such instruction signal, the driver 18 controllably drives the light quantity controlling device 11. By this, the surface 14 can be irradiated with a pulsed laser beam of a stably constant intensity.

Thus, according to the present embodiment, the illumination optical system can supply a pulsed laser beam of constant intensity. Therefore, the amount of exposure for the surface 14 (or the surface 16) can be controlled easily and accurately, e.g., by counting the number of pulses by use of the processing circuit of the monitoring device 17.

Details of the light quantity controlling device 11 will now be described with reference to FIG. 2.

Figure 2:
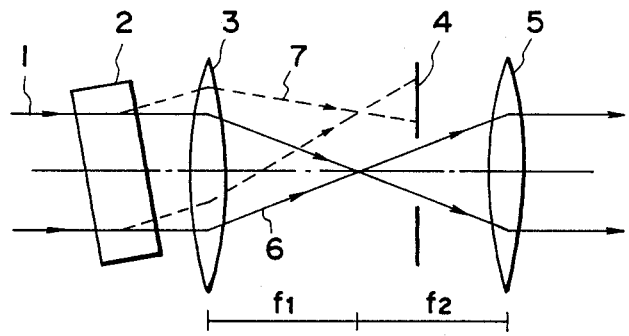
FIG. 2 is a schematic view showing an example of a light quantity controlling device usable in the FIG. 1 embodiment.

FIG. 2 shows an acoustooptic element and some optical elements of the acoustooptic element. Reference character 1 denotes a pulsed laser beam emitted from a pulsed laser, such as the excimer laser 10 (FIG. 1), and this laser beam comprises parallel light. Reference character 2 denotes an acoustooptic element which utilizes a well-known acoustooptic effect wherein, in response to the application of an electric voltage, there occurs a diffraction phenomenon of a magnitude determined by the magnitude of the supplied electric voltage. Reference numeral 3 denotes a first lens group having a focal plane. Reference numeral 4 denotes a spatial filter having a predetermined aperture, formed therein, and being disposed at a predetermined distance from the focal plane of the first lens group 3. Reference numeral 5 denotes a second lens group.

In the FIG. 2 example, these lens groups are disposed so that, when the focal lengths of the first and second lens groups 3 and 5 are denoted by $f_1$ and $f_2$, respectively, the interval between the first and second lens groups 3 and 5 becomes equal to a distance "$f_1+f_2$".

When the pulsed laser beam 1 which comprises parallel light enters into the acoustooptic element 2, the beam 1 is separated into two under the influence of Bragg reflection (diffraction) by a diffraction grating provided by an elastic wave which is formed in the acoustooptic element. Namely, the pulsed laser beam 1 is divided into a zeroth-order diffraction light 6 and a first-order diffraction light 7, both of which are emitted toward the first lens group 3 as illustrated. The sum of the zeroth-order diffraction light 6 and the first-order diffraction light 7 in terms of quantity (or intensity) is equal to or substantially equal to the quantity (or intensity) of the light 1 incident upon the acoustooptic element 2. At this time, the quantity of the first-order diffraction light 7 is proportional to the electric voltage supplied to the acoustooptic element 2. On the other hand, the quantity of the zeroth-order diffraction light 7 is inversely proportional to the electric voltage supplied to the acoustooptic element 2. The present embodiment utilizes such characteristics. Namely, by controlling the electric voltage supplied to the acoustooptic element 2, the quantity of the zeroth-order diffraction light 6 which can pass through the aperture of the spatial filter 4 is controlled. In this manner, the intensity of the pulsed laser beam directed to the surface 15 (FIG. 1) can be adjusted.

It will be understood from FIG. 2 that, in this embodiment, two diffraction lights of the separated zeroth-order diffraction light 6 and first-order diffraction light 7 are focused by the first lens group 3 at different positions on the rear focal plane of the first lens group 3. Then, by means of the spatial filter 4 disposed out of the rear focal plane of the first lens group 3 and having a predetermined aperture formed therein, the first-order diffraction light 7 is intercepted while the zeroth-order diffraction light 6 is allowed to pass through the aperture of the spatial filter 4. The zeroth-order diffraction light 6 passes through the spatial filter 4 and is received by the second lens group 5 whose front focal point is coincident with the rear focal point of the first lens group 3, whereby the received zeroth-order diffraction light 6 is emitted from the second lens group 5 as parallel light.

In the FIG. 2 embodiment, as described hereinbefore, the spatial filter 4 is disposed at a certain distance from the focal plane of the first lens group 3. This is to avoid undesirable damage of the spatial filter 4 which might otherwise be caused if the spatial filter 4 is disposed on the focal plane of the lens group 3 so that the first-order diffraction light to be intercepted may be focused upon a "point" on the light-blocking portion of the filter 4. In such a case, the filter will be easily damaged, particularly when a high-power laser, such as an excimer laser, is used.

Usually, when using light in such a wavelength region as that of the light provided by an excimer laser, the diffraction grating formed in an acoustooptic element, such as denoted by reference numeral 2, will not show high diffraction efficiency. Accordingly, it is preferable to select and use a zeroth-order diffraction light, such as denoted by reference numeral 6 in the present embodiment, as light for illumination.

Figure 3:
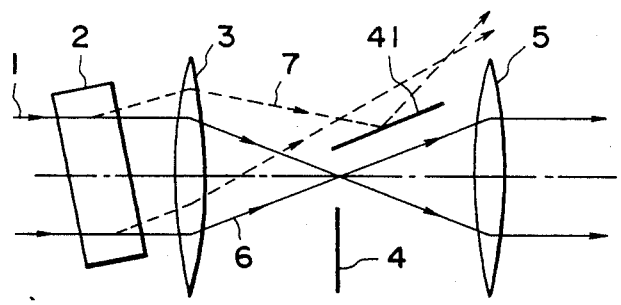
FIG. 3 is a schematic view showing another example of a light quantity controlling device usable in the FIG. 1 embodiment.

For the protection of the spatial filter 4, in the FIG. 2 embodiment and as described hereinbefore, the spatial filter 4 is disposed at a certain distance from the focal plane of the first lens group 3 to prevent an unwanted first-order diffraction light from being focused upon a point on the spatial filter 4. However, other structures are possible to prevent undesirable focusing of unwanted diffraction light upon a point on the spatial filter. An example is illustrated in FIG. 3. In this example, the spatial filter 4 is disposed in the neighborhood of the focal plane of the first lens group 3. However, as illustrated, a portion 41 of the spatial filter 4 to which the converging first-order diffraction light 7 (which is unwanted) is directed, is inclined. As a result, the first-order diffraction light is incident upon the portion 41 in a divergent state. Therefore, the incident energy, per unit area, upon the spatial filter 4 can be reduced satisfactorily.

By use of a simple optical system with a spatial filter, such as described with reference to FIGS. 2 and 3, the present embodiment has achieved a simple and compact light quantity controlling device.

The spatial filter usable in the present embodiment may be provided by a reflective member or light-absorptive member having a predetermined aperture as has been described hereinbefore. Further, it is not always necessary to use a specific member as the spatial filter. Namely, when a lens system having a long focal length is used as the second lens group 5 so that the first-order diffraction light 7 does not enter the entrance pupil of the second lens group 5, the lens group itself can function as a spatial filter.

The illumination optical system 12 of the FIG. 1 embodiment may be provided by a plurality of lens elements and/or mirrors. The projection optical system 15 may comprise an imaging lens system, an example of which has been proposed in Japanese Laid-Open Patent Application, Laid-Open No. Sho61-129828 filed in the name of the assignee of the subject application. Further, the projection optical system 12 may comprise an imaging lens system having lens elements which are made of two different glass materials, such as $SiO_2$ and $CaF_2$. An example of such imaging lens system has been proposed in Japanese Laid-Open Patent Application, Laid-Open No. Sho60-178423 filed in the name of the assignee of the subject application.

While, in the examples shown in FIGS. 2 and 3, the substrate of the acoustooptic element 2 is made of silica ($SiO_2$), it may be made of calcium fluorite ($CaF_2$) material which has a high transmission factor with respect to a laser beam from an excimer laser, similar to that of $SiO_2$ material.

Figure 4:
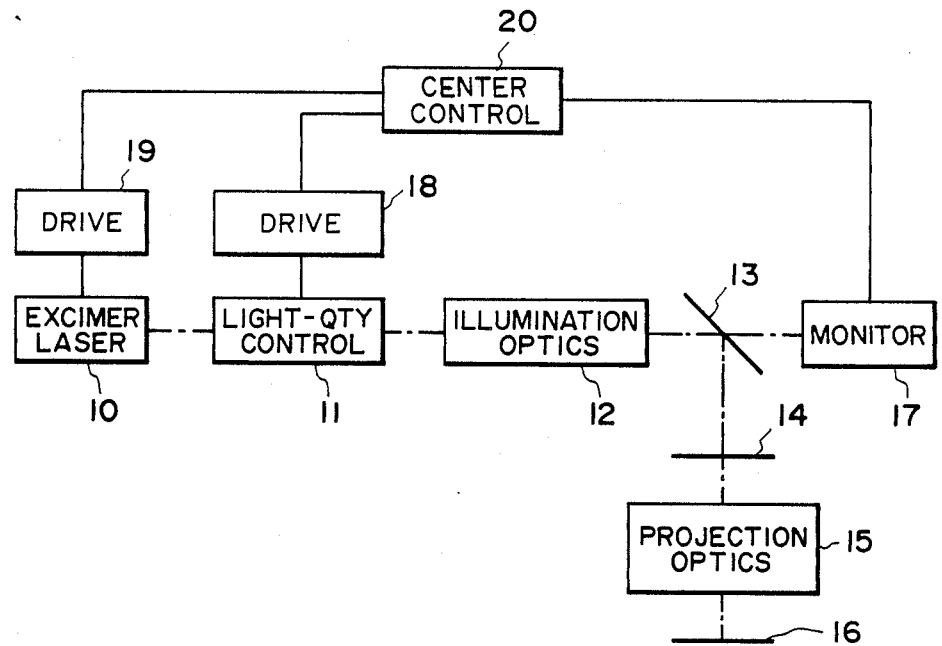
FIG. 4 is a schematic and diagrammatic view of an exposure apparatus according to another embodiment of the present invention.

Referring now to FIG. 4, there is shown a projection exposure system arranged in accordance with another embodiment of the present invention and having an excimer laser used as a light source for exposure, as in the FIG. 1 embodiment.

In FIG. 4, the same reference numerals as shown in the FIG. 1 embodiment are assigned to corresponding or similar elements. In the FIG. 1 embodiment, the monitoring device 17 is directly coupled to the light quantity controlling device 11 by means of a signal line. In the FIG. 4 embodiment, on the other hand, a monitoring device 17 is coupled to a light quantity controlling device 11 by means of a central controller 20. Further, an additional driver 19 is provided to drive an excimer laser 10, and the driver 19 is coupled to the central controller 20 by means of a signal line.

The central controller 20 is operable to supply instruction signals to a driver 18 (for the light quantity controlling device 11) and to the driver 19 by means of respective signal lines, so as to control, with the aid of the driver 18, the electric voltage to be supplied to an acoustooptic element 2 included in the light quantity controlling device 11 and, on the other hand, to control, with the aid of the driver 19, the excitation voltage for the excimer laser 10.

In the present embodiment, the monitoring device 17 has the function of measuring an integrated exposure amount (total exposure amount) by a pulsed laser beam directed to a surface 14 to be illuminated. The amount of exposure, to be provided with regard to the surface 14 or a surface 16 (upon which a circuit pattern should be provided), is preset and the information concerning the preset exposure (exposure amount) is initially stored into a suitable memory included in the central controller 20. At the time of exposure of the surface 16 (namely, at the time of pattern projection), the monitoring device 17 produces successive signals representing an integrated exposure amount (total exposure amount) which increases with time (i.e. with the increase in the number of pulses). The successive signals from the monitoring device 17 are compared by the central controller 20 with the preset exposure amount stored in the memory. The central controller 20 may supply instruction signals to the drivers 18 and 19 so that the integrated exposure amount, designated by the signals, becomes equal to the preset exposure amount.

The exposure system of the present embodiment may be arranged so that one exposure (exposure of one shot) is completed by use of one hundred to several hundreds pulses of the pulsed laser beam supplied from the excimer laser 10. By the "one exposure", one shot area on the surface 16 (wafer surface) is exposed to the pattern of a reticle placed on the plane 14.

The driver 18 may be controlled to supply a desired or predetermined electric voltage to the light quantity controlling device 11 when the last one pulse or, alternatively, the last two or more pulses (e.g. several tens of pulses), of the pulses required for the one exposure, pass through the light quantity controlling device 11. Namely, the driver 18 may be controlled so as to modulate, by the acoustooptic element 2 and as desired, the intensity of the last one pulse or each of the pulses of the end portion of the exposure, to thereby assure that the workpiece 16 (a shot area thereon) is finally exposed with a correct exposure amount (which corresponds to the above-described preset value or which is within a tolerance determined with respect to the preset value). The control of the voltage supply to the light quantity controlling device 11 may be made by calculating, by means of the central controller 20 and on the basis of an electric signal applied thereto from the monitoring device 17 at a moment during the exposure, the exposure energy (exposure amount) to be subsequently applied to the workpiece 16 by the succeeding irradiation with laser beam pulses in the remaining portion of the exposure.

The central controller 20 has the function of discriminating whether or not the integrated exposure amount being monitored by the monitoring device 17 becomes equal to or substantially equal to the preset exposure amount. If the integrated exposure amount reaches the preset value or comes within the tolerance thereof, the central controller 20 supplies an instruction signal to the driver 19 to cause it to stop the supply of the excitation voltage to the excimer laser 10. At the same time, the central controller 20 supplies an instruction signal to the driver 18 so as to cause it to stop the supply of the electric voltage to the light quantity controlling device 11.

Use of multiple pulses for the exposure control is disclosed in detail in Japanese Laid-Open Patent Applications, Laid-Open Nos. Sho60-169136, Sho60-170237, Sho61-154128 and Sho61-162051.

As described hereinbefore, the present embodiment uses an acoustooptic element for the exposure control. Acoustooptic elements have a very good response characteristic, so that they can follow the short duration of the emission of the pulsed laser beam, sufficiently. Therefore, the intensity modulation can be easily affected for each pulse, with the result that the exposure can be controlled very precisely. It should be noted that the drive of an excimer laser, such as at 10, in FIG. 4 can be controlled basically only by "ON-OFF" switching the excitation voltage.

Figure 5:
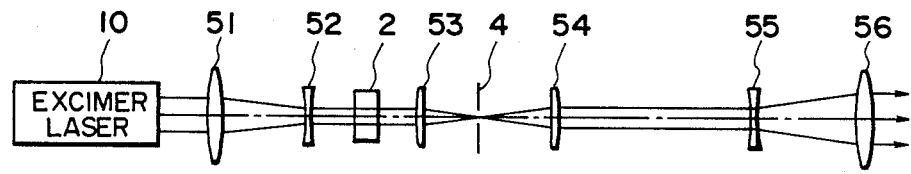
FIG. 5 is a schematic view showing an example of a light quantity controlling device usable in the FIG. 4 embodiment.

FIG. 5 shows an example of a light quantity controlling device usable in the exposure system of the FIG. 4 embodiment. As shown in FIG. 5, the light quantity controlling device includes, in order from the excimer laser 10 side, a lens 51, a lens 52, an acoustooptic element 2, a lens 53, a spatial filter 4, a lens 54, a lens 55 and a lens 56. In FIG. 4, the same reference numerals as that in the FIG. 3 example are assigned to corresponding or similar elements.

The pulse laser beam emitted from the excimer laser 10 comprises parallel light, and such a pulsed laser beam is transformed into parallel light having a reduced beam diameter by means of an afocal converter formed by the lenses 51 and 52. The reduced parallel light passes through the acoustooptic element 2 and enters the lens 53, by which it is focused upon a focal point position of the lens 53. In this example, at this focal point position, is disposed the spatial filter 4 which has a good durability to the laser beam. The special filter 4 has an aperture, and the light passing through the aperture is transformed into parallel light by the lens 54. The parallel light from the lens 54 is expanded by a beam expander provided by the lenses 55 and 56, whereby the diameter of the parallel light is enlarged. The enlarged light is then directed to the illumination optical system 12 (FIG. 4). At this time, the beam diameter of the light is suitably determined by the beam expander so that it matches the structure of the illumination optical system 12.

The manner of intensity modulation of the pulsed laser beam by use of the acoustooptic element 2 in this embodiment is essentially the same as that described with reference to FIG. 2.

In the present embodiment, as described, the beam diameter of the pulsed laser beam from the excimer laser 10 is reduced. This is made to reduce the size of the acoustooptic element 2. On the other hand, after the modulation, the beam diameter of the pulsed laser beam is enlarged for matching with the illumination optical system 12.

While the invention has been described with reference to the structures disclosed herein, it is not confined to the details set forth and this application is intended to cover such modifications or changes as may come within the purposes of the improvements or the scope of the following claims.

What is claimed is:

1. An exposure system for optical lithography comprising:
   an excimer laser;
   an acoustooptic element disposed in a path of a pulsed laser beam emitted from said excimer laser, said acoustooptic element modulating the intensity of the pulsed laser beam incident thereupon; and
   an optical system for exposing a workpiece with the pulsed laser beam passing through said acoustooptic element for printing a circuit pattern on the workpiece,
   wherein said acoustooptic element includes a substrate made of $SiO_2$ and wherein said acoustooptic element produces an elastic wave within said substrate, the pulsed laser beam passing through said substrate being diffracted such that the intensity of the pulsed laser beam is modulated.

2. An exposure system according to claim 1, further comprising a spatial filter disposed in the path of the pulsed laser beam between said acoustooptic element and said optical system, for directing only diffraction light of a predetermined order produced by said acoustooptic element to said optical system.

3. An exposure system for optical lithography comprising:
   a pulsed laser for emitting a pulsed laser beam;
   an optical system for exposing a workpiece with a pulsed laser beam emitted from said pulsed laser for printing a circuit pattern on the workpiece, said optical system comprising an acoustooptic element for modulating the intensity of a received laser beam;
   a monitoring system comprising means for receiving a portion of the pulsed laser beam from said pulsed laser and for monitoring the amount of exposure with respect to the workpiece; and
   control means for controlling said acoustooptic element in accordance with the monitoring by said monitoring system.

4. An exposure system for optical lithography comprising:
   an excimer laser;
   an acoustooptic element disposed in a path of a pulsed laser beam emitted from said excimer laser, said acoustooptic element modulating the intensity of the pulsed laser beam incident thereupon;
   an optical system for exposing a workpiece with the pulsed laser beam passing through said acoustooptic element for printing a circuit pattern on the workpiece;
   a first lens system for reducing the diameter of the laser beam emitted from said excimer laser and for directing the laser beam toward said acoustooptic element; and
   a second lens system for enlarging the diameter of the laser beam passing through said acoustooptic element and for directing the laser beam toward said optical system.

5. An exposure system according to claim 4, wherein said first lens system comprises means for directing parallel light to said acoustooptic element.

6. An exposure apparatus according to claim 5, wherein said second lens system comprises means for directing parallel light to said optical system.

7. A projection exposure system for optical lithography, comprising:
an excimer laser;
a projection optical system for projecting a circuit pattern of a reticle upon a wafer by a pulsed laser beam emitted from said excimer laser for printing the circuit pattern of the reticle on the wafer;
an illumination system for illuminating the reticle with the pulsed laser beam from said excimer laser, said illumination system comprising an acoustooptic element adapted to be driven in response to an applied signal for modulating the intensity of the pulsed laser beam; and
a monitoring system for receiving a portion of the pulsed laser beam directed to the wafer and for monitoring the amount of exposure with respect to the wafer, said monitoring system providing an output signal for controlling said acoustooptic element by the applied signal.

8. A projection exposure apparatus according to claim 7, further comprising driving means for driving said excimer laser, said driving means comprising means for deactivating said excimer laser in response to an output signal from said monitoring system.

9. A projection exposure system according to claim 7, wherein said acoustooptic element comprises a substrate made of $SiO_2$ and wherein said acoustooptic element produces an elastic wave within said substrate, the pulsed laser beam passing through said substrate being diffracted such that the intensity of the pulsed laser beam is modulated.

10. A projection exposure system according to claim 9, wherein said projection optical system comprises a plurality of lens elements each made of $SiO_2$.

11. A projection exposure system according to claim 7, wherein the wafer is exposed by a plurality of pulses of the laser beam and wherein said acoustooptic element modulates the intensity of at least one of the pulses of the laser beam.

12. A projection exposure system according to claim 7, wherein said illumination system comprises means for directing a zeroth order diffraction component of a laser beam pulse to the reticle.

13. A projection exposure system according to claim 7, wherein said monitoring system comprises means for receiving a laser beam pulse directed from said acoustooptic element to the reticle.

14. An exposure system according to claim 3, wherein said pulsed laser comprises an excimer laser and wherein said optical system further comprises means for exposing the workpiece with a plurality of laser beam pulses sequentially output from said excimer laser for printing the circuit pattern on the workpiece.

15. An exposure system according to claim 14, wherein said monitoring system comprises means for receiving a portion of each of the laser beam pulses for producing, in sequence, signals corresponding to the intensities of the receiving portions, and said monitoring system further comprises detecting means for detecting the amount of exposure with respect to the workpiece on the basis of the sequentially produced signals, and said control means comprises means for controlling said excimer laser for stopping emission of the pulsed laser beam from said excimer laser when the amount of exposure detected by said detecting means substantially equals a predetermined exposure amount set for the pattern printing.

16. An exposure system according to claim 14, wherein said excimer laser comprises a KrF excimer laser.

17. An exposure system according to claim 14, wherein said control means comprises means for controlling said acoustooptic element for modulating the intensity of at least one of the plurality of laser beam pulses.

18. An exposure system according to claim 3, wherein said monitoring system further comprises means for receiving a portion of the pulsed laser beam emitted from said pulsed laser and passing through said acoustooptic element.

19. A projection exposure system according to claim 7, wherein said illumination system comprises a first optical system for reducing the diameter of a received pulsed laser beam and for directing the diameter reduced pulsed laser beam to said acoustooptic element and a second optical system for receiving the pulsed laser beam from said first optical system through said acoustooptic element for enlarging the diameter of the received pulsed laser beam and for directing the diameter enlarged pulse laser beam to the reticle.

* * * * *

UNITED STATES PATENT AND TRADEMARK OFFICE
CERTIFICATE OF CORRECTION

PATENT NO. : 4,947,047
DATED : August 7, 1990
INVENTOR(S) : Masato Muraki

It is certified that error appears in the above-identified patent and that said Letters Patent is hereby corrected as shown below:

COLUMN 1

Line 17, "greater" should read --greater,--.

COLUMN 10

Line 47, "pulse laser beam" should read --pulsed laser beam--.

Signed and Sealed this

Nineteenth Day of January, 1993

Attest:

DOUGLAS B. COMER

Attesting Officer

Acting Commissioner of Patents and Trademarks